United States Patent [19]
Mitwalsky et al.

[11] Patent Number: 5,776,826
[45] Date of Patent: Jul. 7, 1998

[54] CRACK STOP FORMATION FOR HIGH-PRODUCTIVITY PROCESSES

[75] Inventors: Alexander Mitwalsky, Dutchess County, N.Y.; James Gardner Ryan, Newtown, Conn.

[73] Assignee: International Business Machines Corporation, Armonk, N.Y.

[21] Appl. No.: 642,983

[22] Filed: May 6, 1996

[51] Int. Cl.$^6$ .................................................. H05K 3/06
[52] U.S. Cl. .......................... 438/622; 438/4; 438/759; 438/689
[58] Field of Search ................... 438/4, 622, 759, 438/689

[56] References Cited

U.S. PATENT DOCUMENTS

| | | | |
|---|---|---|---|
| 5,096,855 | 3/1992 | Vokoun, III | 437/227 |
| 5,132,252 | 7/1992 | Shiraiwa et al. | 437/227 |
| 5,206,181 | 4/1993 | Gross | 437/8 |
| 5,414,297 | 5/1995 | Morita et al. | 257/620 |
| 5,530,280 | 6/1996 | White | 257/508 |
| 5,665,655 | 9/1997 | White | 438/584 |

*Primary Examiner*—John Kight
*Assistant Examiner*—Everett White
*Attorney, Agent, or Firm*—Whitham, Curtis & Whitham; Daryl Neff

[57] ABSTRACT

A simplified crack stop formation compatible with shallow fuse etch processes which are utilized for modern low-cost redundancy designs using upper level metal fuses. A modified last level metallization (LLM) etch according to the invention allows a high-productivity single step bondpad/fuse/crack stop etch. The stack of metal films formed at the edge of the dicing channel is readily removed with a modified LLM etch prior to dicing causing the insulator films covering the dicing channel to be physically separated from the insulators coating the electrically active chip areas. The separation prevents cracks that could propagate through the insulators of the dicing channel in to the active chip.

7 Claims, 1 Drawing Sheet

CRACK STOP FORMATION FOR HIGH-PRODUCTIVITY PROCESSES

BACKGROUND OF THE INVENTION

1. Field of the Invention

The present invention generally relates to the manufacture of microelectronic devices and, more particularly, to the formation of crack stops which separate the dielectric films on a semiconductor substrate.

2. Background Description

Multiple integrated circuits (ICs) are formed on a semiconductor wafer and then separated into chips by dicing the wafer. During chip dicing, sometimes cracking of dielectric films on the semiconductor substrates occurs. The cracks propagate over long distances into the active chip area causing reliability problems. Therefore, a crack stop is usually formed by interruption of the dielectric film. Thus, cracks which are possibly created during chip dicing cannot penetrate the chip area.

For a high-productivity process, the crack stop formation has to be combined with already existing processes. Usually, a combined bondpad/fuse/crack stop etch is employed. The fuse etch requires a well defined etch into the dielectric films (passivation and interlevel dielectrics). For fuses lying close to the substrate level (e.g., polysilicon or polycide fuses), the deep fuse etch usually reaches lower level metallizations which consist of different material than the upper metallization. Thus, a subsequent etch (for example, a hydrogen-peroxide wet etch) is capable of removing a lower level metallization (such as tungsten) selective to the upper level metallization (such as aluminum) which is already opened at the bondpads. As a result, a crack stop can easily be formed by a combined bondpad/fuse/crack stop etch by simply adding a selective wet etch of the lower metallization.

However, for advanced design of fuses lying on upper metallization levels, the fuse etch is not deep enough to reach lower metallization levels with a different material. Therefore, other strategies for the crack stop formation have to be considered.

SUMMARY OF THE INVENTION

It is therefore an object of the present invention to provide a simplified crack stop formation compatible with shallow fuse etch processes which are utilized for modern low-cost redundancy designs using upper level metal fuses.

According to the invention, two approaches are used to form a crack stop, each approach avoiding a dedicated crack stop pattern and etch step for high-productivity manufacturing of integrated circuits. In both approaches, a metal stack at least up to the metallization level which will be completely opened during the fuse etch is created along the crack stop line. This includes also contact and via levels which have to be preformed as connected lines. It is essential that there is no connection of the dielectric films between dicing and chip area.

The first approach used to form a crack stop leaves the metal stack as it is. Due to the different physical properties of metals compared to dielectric films, the crack cannot penetrate through the metal line.

The second approach requires a last level metallization (LLM) patterning by etching, such as reactive ion etching (RIE). During LLM etching, the LLM will be etched off at the crack stop line. Then, the underlying contacted metallization levels consisting of the same metallurgy can be etched by a slightly prolonged modified LLM etch. The following combined bondpad/fuse/crack stop etch results in further removal of interlevel dielectric films. Thus, lower level metallization of different metallurgy is opened which can be optionally removed by a subsequent etch process working selectively to LLM metallurgy (bondpad).

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
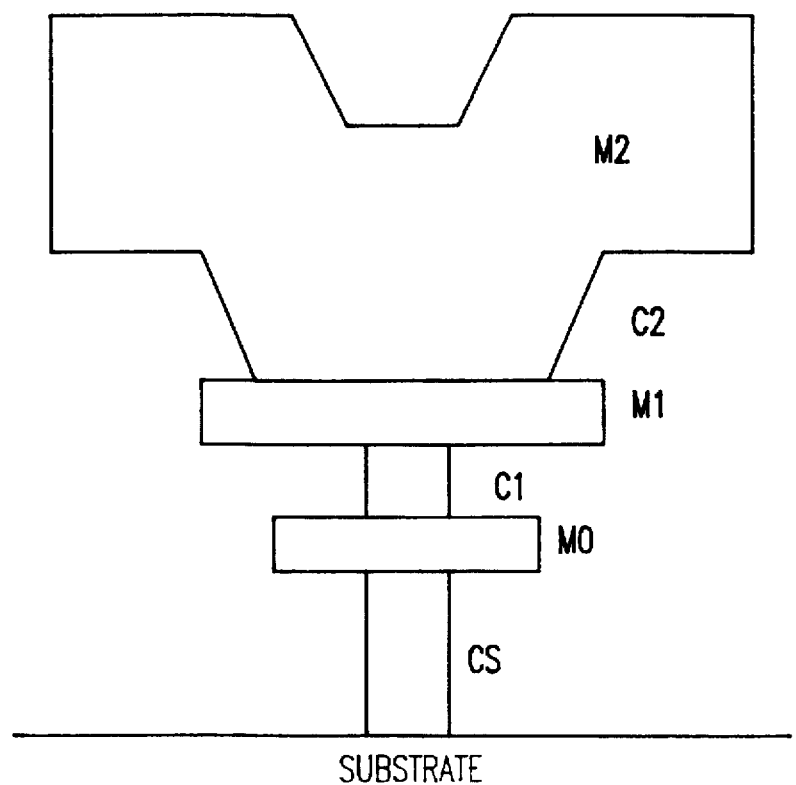
FIG. 1 is a cross-sectional view schematically showing a complete metal stack including last level metallurgy.

Referring now to the drawings, and more particularly to FIG. 1, there is shown a complete metal stack, before last level metallurgy (LLM) etch. This example shows contacts to substrate (CS), three metallization levels (M0, M1, M2) and two via levels (C1, C2). The metal stack is formed at least up to the metallization level which will be completely opened during the fuse etch along the crack stop line. The LLM is represented here by metallization M2 and may be, for example, aluminum or an aluminum alloy. The via level C2 and the metallization level M1 just below the LLM metallization M2 are the same or similar metallurgy, in this example, aluminum or aluminum alloy. The metal stack includes also contact and via levels which have to be preformed as connected lines. This lower level metallurgy is represented by the levels CS, M0 and C1 and may include, for example, a chemical vapor deposition (CVD) tungsten. Representative compositions of the various levels shown in FIG. 1 are listed below:

| M2/C2 | Ti/AlCu/TiN |
| M1 | Ti/TiN/AlCu/Ti/Tin |
| C1 | Ti/TiN/CVD W |
| M0 | Ti/TiN/CVD W |
| CS | Ti/TiN/CVD W |

Metallizations M1 and M2 may also be composed of multiple layers of refractory films and other aluminum alloys.

The first approach to crack stop formation according to the invention leaves the metal stack as it is, as generally illustrated in FIG. 1. Due to the different physical properties of metals compared to dielectric films, the crack cannot penetrate through the metal line.

Figure 2:
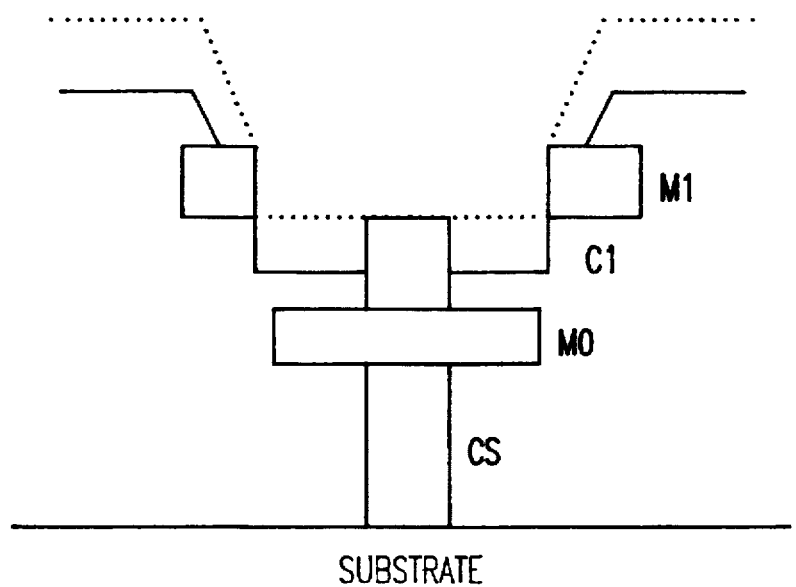
FIG. 2 is a cross-sectional view schematically showing the result of a modified last level metallurgy etch and fuse etch.

The second approach is illustrated in FIG. 2 and requires a last level metallization (LLM) patterning by etching, such as reactive ion etching (RIE). The LLM contact (M2/C2) to the underlying metallization (M1) is etched off at the crack stop line. Then, the underlying contacted metallization levels consisting of the same metallurgy (M1) can be etched by a slightly prolonged modified LLM etch, resulting in the dashed line of FIG. 2. At this point in the process, a partial metal stack (C1/M0/CS) remains and serves as the crack stop.

The process can be taken further with a combined bondpad/fuse/crack stop etch resulting in further removal of interlevel dielectric films, as illustrated by the full line in FIG. 2. Thus, the lower level metallization (C1/M0/CS) of different composition is opened which can be removed by a subsequent etch process working selectively to the LLM metallurgy (bondpad).

The modified LLM etch according to the invention allows a high-productivity single step bondpad/fuse/crack stop etch. The remaining stack of metal films formed at the edge of the dicing channel may be readily removed after the modified LLM etch prior to dicing causing the insulator films covering the dicing channel to be physically separated from the insulators coating the electrically active chip areas. The separation prevents cracks that could propagate through the insulators in the dicing channel into active chip area.

While the invention has been described in terms of two preferred embodiments, those skilled in the art will recognize that the invention can be practiced with modification within the spirit and scope of the appended claims.

Having thus described our invention, what we claim as new and desire to secure by Letters Patent is as follows:

1. A method of forming a crack stop in high-productivity manufacture of integrated circuit chips on a wafer substrate comprising the step of creating a metal stack line along a crack stop line, said metal stack line comprising a lower level metallization reaching from the wafer substrate to an upper metallization level and including contact and via levels preformed as connected lines, said metal stack line defining a line between a dicing channel and chip areas of the integrated circuit chips.

2. The method of claim 1 wherein said upper level metallization includes a last level metallization and an underlying level of metallization, said method further comprising the steps of:

patterning by etching the last level metallization to the underlying metallization of the same or similar composition as the last level metallization; and etching the underlying metallization at the crack stop line by a prolonged etch used in patterning the last level metallization.

3. The method of claim 2 further comprising the step of performing a combined bondpad/fuse/crack stop etch to open said lower level metallization.

4. The method of claim 3 wherein the composition of the lower level metallization is different from the metallization of the upper level metallization, said method further comprising the step of performing a subsequent etch process to remove said lower level metallization selectively to the upper level metallization.

5. A semiconductor wafer structure comprising:
   a plurality of integrated circuit areas formed on the wafer; and
   a metal stack line along a crack stop line between said integrated circuit areas, said metal stack line comprising a lower level metallization reaching from the wafer substrate to an upper metallization level and including contact and via levels preformed as connected lines, said metal stack line defining a line between a dicing channel and chip areas of integrated circuit chips formed by dicing the semiconductor wafer.

6. The semiconductor wafer structure of claim 5 wherein said upper level metallization includes a last level metallization and an underlying level of metallization, the underlying metallization having the same or similar composition as the last level metallization, and wherein the composition of the lower level metallization is different from the metallization of the upper level metallization and may be etched selectively to the upper level metallization.

7. The semiconductor wafer structure of claim 6 wherein said upper level metallization comprises aluminum or an aluminum alloy and said lower level metallization comprises tungsten.

* * * * *

UNITED STATES PATENT AND TRADEMARK OFFICE
CERTIFICATE OF CORRECTION

PATENT NO. : 5,776,826
DATED : July 7, 1998
INVENTOR(S) : Alexander Mitwalsky, et al.

It is certified that error appears in the above-identified patent and that said Letters Patent is hereby corrected as shown below:

On the face of the patent, in the Assignee information, after ". . .Armonk, N.Y.", insert --SIEMENS AKTIENGESELLSCHAFT, MUNICH, FEDERAL REPUBLIC OF GERMANY.--

Signed and Sealed this

Twenty-first Day of September, 1999

Attest:

Q. TODD DICKINSON

*Attesting Officer*           *Acting Commissioner of Patents and Trademarks*